United States Patent [19]

Sugimoto et al.

[11] Patent Number: 5,254,530
[45] Date of Patent: Oct. 19, 1993

[54] MOCVD OF A-AXIS OR B-AXIS ORIENTED SUPERCONDUCTING BI-SR-CA-CU-O FILMS

[75] Inventors: Tsunemi Sugimoto, Yamaguchi; Kazushi Sugawara, Tokyo; Mikio Nakagawa; Yuh Shiohara, both of Tokyo, all of Japan

[73] Assignees: International Superconductivity Technology Center, Tokyo; Ube Industries, Ltd., Yamaguchi; Sharp Corporatoin, Osaka; Fujikura Ltd., Tokyo, all of Japan

[21] Appl. No.: 900,370

[22] Filed: Jun. 18, 1992

[30] Foreign Application Priority Data

Jun. 24, 1991 [JP] Japan ................... 3-151689

[51] Int. Cl.$^5$ .............................. C23C 16/00
[52] U.S. Cl. ....................... 505/1; 505/734; 505/730; 427/62; 427/255.3; 427/255.2; 427/255.1; 427/126.3; 427/314; 428/930
[58] Field of Search ............. 505/1, 730, 734; 427/62, 63, 255.3, 255.2, 255.1, 126.3, 314; 428/930

[56] References Cited

FOREIGN PATENT DOCUMENTS 446145 9/1991 European Pat. Off. .
1-257194 10/1989 Japan .
2-252618 11/1990 Japan .
9107236 5/1991 PCT Int'l Appl. .
9119026 12/1991 PCT Int'l Appl. .

OTHER PUBLICATIONS

Sugimoto et al., "Metalorganic Chemical vapor deposition of $B_i$—$S_r$—$C_a$—$C_u$—O ultrathin films", J. Appl. Phys. 70(3) Aug. 1991, pp. 1600–1605.

Endo et al., "Growth and properties of $B_i$-$S_r$-$C_a$-$C_u$-O superconducting films by MOCVD", Thin Solid Films, 206, Dec. 1991 pp. 125–127.

Natori et al., "Superconducting $B_i$-$S_r$-$C_a$-$C_u$-O Thin Films Grown by Metalorganic Chemical Vapor deposition at different temperatures", Jpn. J. Appl. Phys. 28(9) Sep. 1989 pp. 1578–1580.

Yamane et al., "Preparation of $B_i$-$S_r$-$C_a$-$C_u$-O films by chemical vapor deposition with metal chelate and alkoxide" Chemistry letters (1988) pp. 1515–1516.

*Primary Examiner*—Roy King
*Attorney, Agent, or Firm*—Kanesaka and Takeuchi

[57] ABSTRACT

A Bi-Sr-Ca-Cu-O-type superconductive film is formed on an MgO (100) single crystal substrate by the chemical vapor deposition method at a film formation speed of 780° C. or less and a film formation speed of 1.0 nm/min or more, and exhibits an a-axis or b-axis preferential growth with respect to the substrate surface.

10 Claims, No Drawings

MOCVD OF A-AXIS OR B-AXIS ORIENTED SUPERCONDUCTING BI-SR-CA-CU-O FILMS

BACKGROUND OF THE INVENTION

1. Field of the Invention

The present invention relates to a method of fabricating a Bi-Sr-Ca-Cu-O superconductive film and, in particular, to a superconductive film of an a-axis or b-axis preferential orientation with respect to a substrate surface, which is very effective for Josephson devices, three-terminal devices or the like.

2. Description of the Related Art

Because of the high superconductivity critical temperature (Tc), oxide-type superconductive films are expected to be applied to electronic devices, such as transistors and Josephson junction devices. However, the superconductivity of an oxide-type superconductive film exhibits a strong anisotropy, so that it requires a film orientation control. In the case of device application, in particular, a device structure whose ab crystal surface with a large coherence length ($\zeta$) allows a flow of electric current is advantageous from the viewpoint of the properties of the device to be obtained. For this purpose, it is important that the film should be of a-axis or b-axis orientation with respect to the substrate surface.

Conventionally known methods of fabricating oxide-type superconductive films include the PVD (physical vapor deposition) method and the CVD (chemical vapor deposition) method. The lower limit of the film formation speed in the PVD method is relatively high as compared to that in the CVD method, and a reduction in speed in the PVD method will result in the irregular film formation speed and the film composition, thereby making it difficult to obtain an ultra-thin film which is considered producible at low film formation speed (*Applied Physics Letters.* Vol., 53, No. 7, 1988, pp. 624).

Generally speaking, it is possible with the CVD method to maintain the saturated vapor of the material compound stable within a fixed temperature range. Further, before they are caused to react so as to effect film formation on a substrate, the vapor and the oxidizing gas are separated from each other, so that it is possible to cause the requisite reaction to take place exclusively on the substrate (*Journal of Applied Physics*, Vol. 67, No. 3, 1990, pp. 1562). In this respect, the method is superior to the PVD method, in which it is difficult to control the reaction between the material gas and the oxidizing gas and the material vapor concentration in the system is unstable.

Thus, it is more advantageous from the industrial point of view, to fabricate oxide-type superconductive films by the CVD method.

As stated above, when using oxide-type superconductive films for various types of devices, an a-axis or b-axis film orientation is desirable. However, because of their strong anisotropy in crystal structure, oxide-type superconductive films have been inclined to c-axis orientation, which is particularly true for the Bi-Sr-Ca-Cu-O-type superconductive films.

There have conventionally been reported examples of a Bi-Sr-Ca-Cu-O-type superconductive film in which an a-axis or b-axis preferential growth is effected by sputtering, as well as examples of a Y-Ba-Cu-O-type superconductive film in which an a-axis or b-axis preferential growth is effected by the CVD method. However, there has been provided as yet no Bi-Sr-Ca-Cu-O-type superconductive film of a-axis or b-axis orientation prepared by the CvD method.

Thus, there has been a request for a formation of a Bi-Sr-Ca-Cu-O-type superconductive film of a-axis or b-axis orientation with respect to the substrate surface by the CVD method.

SUMMARY OF THE INVENTION

It is an object of the present invention to provide a A Bi-Sr-Ca-Cu-O-type superconductive film fabrication method which makes it possible for a Bi-Sr-Ca-Cu-O-type superconductive film of an a-axis or b-axis preferential growth with respect to the substrate surface, which is useful as a material for various types of devices, to be provided by the CVD method, which is advantageous from the industrial point of view in forming oxide-type superconductive films.

In accordance with a first aspect of the present invention, there is provided a Bi-Sr-Ca-Cu-O-type superconductive film formed on an MgO (100) single crystal substrate by the chemical vapor deposition method and featuring an a-axis or b-axis preferential growth with respect to the substrate surface.

In accordance with another aspect of the present invention, there is provided a method of fabricating a Bi-Sr-Ca-Cu-O-type superconductive film according to the first aspect of the present invention, the method featuring a film formation on an MgO (100) single crystal substrate by the chemical vapor deposition method, at a film formation temperature or substrate temperature of 780° C. or less and a film forming speed of 1.0 nm/min or more.

DETAILED DESCRIPTION OF THE PREFERRED EMBODIMENTS

The present invention will now be described in detail.

Examples of the chemical composition of an Bi-Sr-Ca-Cu-O-type superconductor forming a Bi-Sr-Ca-Cu-O-type superconductive film according to the present invention include the following:

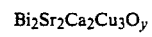

To improve Tc (the critical temperature), the above compositions may further include Pb.

A Bi-Sr-Ca-Cu-O-type superconductive film according to the present invention as described above is formed on an MgO single crystal substrate of a plane index of [100] by the CVD (chemical vapor deposition) method.

In the following, a method of fabricating a Bi-Sr-Ca-Cu-O-type superconductive film according to the present invention will be described.

A Bi-Sr-Ca-Cu-O-type superconductive film according to the present invention is fabricated by the CVD method, according to which a thin film is formed through deposition on an MgO (100) single crystal substrate, using reactant gases, a carrier gas, and an oxidizing gas in conformity with fixed chemical compositions.

Examples of the material gases used in the present invention include organometallic complexes of Bi, Sr, Ca, Cu, or the like.

Examples of the organic portions of the organometallic complexes, i.e., the complex ligands, include: acetylacetone (hereinafter abbreviated as "acac"), dipivaloylmethane (hereinafter abbreviated as "DPM"), cyclopentadiene, and further, a compound as can be represented by the following formula:

$$R-CO-CH_2-CO-C(CH_3)_3$$

(where R indicates a fluorinated lower alkyl group of a carbon number of 1~4.)

Use of such ligands facilitates the synthesis and isolation of the metal complexes and enables the vapor pressure of the organometallic complexes to be low, so that it is very advantageous in preparing the reactant gases. Other examples of the ligands include phenyl group (hereinafter abbreviated as "ph"), alkyl group and aryl group. The alkyl group comprises methyl group (hereinafter abbreviated as "Me"), and ethyl group (hereinafter abbreviated as "Et"). Examples of the fluorinated lower alkyl group represented by R in the above formula include trifluoromethyl group, pentafluoroethyl group (hereinafter abbreviated as "PPM"), and heptafluoropropyl group.

Examples of the organometallic complexes used as the material gases include the following:

Bi(ph)$_3$, Bi(DPM)$_3$,
BiMe$_3$, BiEt$_3$, Bi alcoholate,
Sr(DPM)$_2$, Sr(PPM)$_2$,
Ca(DPM)$_2$, Ca(PPM)$_2$,
Cu(DPM)$_2$, Cu(PPM)$_2$, and Cu(acac)$_2$ Examples of the carrier gas used in the present invention when feeding the reactant gases to the reactor include inactive gases, such as Ar, He and Ne, and further, N$_2$.

Examples of the oxidizing gas used in the present invention include O$_2$, O$_3$, air, N$_2$O and NO$_2$. The partial pressure of the oxidizing gas in the entire gas is preferably 0.01 to 760 torr and, in particular, 1 to 10 torr.

In film formation, the temperature of the MgO (100) single crystal substrate, i.e., the film formation temperature, is set at 780° C. or less. A film formation temperature higher than 780° C. would make it impossible to obtain a Bi-Sr-Ca-Cu-O-type superconductive film of an a-axis or b-axis preferential orientation with respect to the substrate surface.

The film formation speed is set at 1.0 nm/min or more. A film formation speed less than 1.0 nm/min would make it impossible to obtain a Bi-Sr-Ca-Cu-O-type superconductive film of an a-axis or b-axis preferential orientation with respect to the substrate surface.

In the present invention, it is particularly desirable that the film formation be conducted at a film formation temperature or temperature substrate of 780° to 750° C. and a film formation speed of 1.0 to 2.0 nm/min.

Usually, a preferable thickness of a Bi-Sr-Ca-Cu-O-type superconductive film obtained in this way is in the range of approximately 100 to 1000 nm.

The Bi Sr-Ca-Cu-O-type superconductive film of the present invention is a high-property superconductor in which Tc is generally 50 to 100K, and exhibits an a-axis or b-axis preferential orientation in growth with respect to the substrate surface, so that it is very useful for various types of devices.

By using an MgO (100) single crystal as the substrate and effecting film formation at a film formation temperature of 780° C. or less and a film formation speed of 1.0 nm/min or more, it is possible for a Bi-Sr-Ca-Cu-O-type superconductive film of a-axis or b-axis orientation with respect to the substrate surface to be easily obtained by the CVD method.

EXAMPLES

The present invention will now be described more specifically with reference to examples and comparative examples. In the following, gas flow rate will be given in sccm, in terms of cc/min at 1 atm and 25° C.

EXAMPLE 1

By using reactant gases shown in Table 1, a Bi-Sr-Ca-Cu-O-type superconductive film was fabricated. The substrate used and the fabricating conditions are shown in Table 2.

TABLE 1

| Reactant gas | Temperature and flow rate* |
|---|---|
| Bi(ph)$_3$ | 87° C., 50 sccm |
| Sr(DPM)$_2$ | 215° C., 50 sccm |
| Ca(DPM)$_2$ | 183° C., 50 sccm |
| Cu(DPM)$_2$ | 102° C., 50 sccm |

*Temperature and flow rate when the evaporated material gases are caused to flow out into the reactor along with Ar as the carrier gas.

TABLE 2

| | |
|---|---|
| Oxidizing gas | O$_2$ |
| Substrate | MgO single crystal (plane index: [100]) |
| Substrate temperature | 780° C. |
| Total pressure (Reactant gases + Ar + O$_2$) | 10 torr |
| O$_2$ partial pressure | approximately 6.7 torr |
| O$_2$ flow rate | 400 sccm |
| Film formation speed | approximately 1 nm/min |

As a result, a film having a thickness of approximately 130 nm was formed after a film formation process of approximately 2 hours. The properties of the Bi-Sr Ca-Cu-O type superconductive film thus obtained were as follows:

XRD spectrum: a crystal substrate of a-axis or b-axis orientation exhibiting peaks corresponding to the plane indexes of (100), (200), (300), and (400).

Chemical composition: Bi$_2$Sr$_2$Ca$_1$Cu$_2$O$_x$

Critical temperature: approximately 50 to 60K

EXAMPLES 2~6, COMPARATIVE EXAMPLES 1~9

Film formation was conducted in the same manner as in Example 1, except that the film formation speeds and film formation temperatures (substrate temperatures) shown in Table 3 were adopted. The crystal orientation of each of the films obtained was measured by XRD and evaluated by the following criteria. The results are shown in Table 3 together with Example 1.

Criteria for Evaluation:

○ = A Bi-Sr-Ca-Cu-O-type superconductive film of an a-axis or b-axis preferential orientation was obtained.

Δ = A Bi-Sr-Ca-Cu-O-type superconductive film including a component of a-axis or b-axis orientation and a component of c-axis orientation in the same proportion was obtained.

X = A Bi-Sr-Ca-Cu-O-type superconductive film of a c-axis preferential orientation was obtained.

TABLE 3

| Film formation temperature (°C.) | Film formation speed (mm/min.) | | |
| --- | --- | --- | --- |
| | 2.5 | 1.0 | 0.5 |
| 720 | ○ Example 2 | ○ Example 3 | △ Comp. Ex. 1 |
| 750 | ○ Example 4 | ○ Example 5 | △ Comp. Ex. 2 |
| 780 | ○ Example 6 | ○ Example 1 | △ Comp. Ex. 3 |
| 820 | △ Comp. Ex. 4 | X Comp. Ex. 5 | X Comp. Ex. 6 |
| 850 | X Comp. Ex. 7 | X Comp. Ex. 8 | X Comp. Ex. 9 |

It is obvious from Table 3 that in accordance with the present invention, a high-property Bi-Sr-Ca-Cu-O-type superconductive film of an a-axis or b-axis preferential orientation can be obtained.

What is claimed is:

1. A method of fabricating a Bi-Sr-Ca-Cu-O superconductive film comprising, forming a Bi-Sr-Ca-Cu-O superconductive film on an MgO (100) single crystal substrate by a chemical vapor deposition method at a substrate temperature of 780° C. or less and a film formation speed of 1.0 nm/min to 2.5 nm/min so that the Bi-Sr-Ca-Cu-O superconductive film consisting essentially of an a-axis or b-axis orientation with respect to a substrate surface is grown on the substrate, said chemical vapor deposition method including reaction gases of organometallic complexes of Bi, Sr, Ca and Cu, a carrier gas and an oxidizing gas, partial pressure of said oxidizing gas being from 1 to 10 torr.

2. A method according to claim 1, wherein said Bi-Sr-Ca-Cu-O superconductive film contains Pb.

3. A method according to claim 1, wherein ligand of said organometallic complexes is at least one selected from the group consisting of acetylacetone, dipivaloylmethane, cyclopentadiene, and a compound as can be represented by the following formula:

$$R-CO-CH_2-CO-C(CH_3)_3$$

where R indicates a fluorinated lower alkyl group of a carbon number of 1~4.

4. A method according to claim 3, wherein said fluorinated lower alkyl group represented by R in the above formula is selected from the group consisting of trifluoromethyl group, pentafluoroethyl group, and heptafluoropropyl group.

5. A method according to claim 1, wherein ligand of said complexes is at least one selected from the group consisting of phenyl group, methyl group, ethyl group and aryl group.

6. A method according to claim 1, wherein the organometallic complex of Bi is at least one selected from the group consisting of $Bi(ph)_3$, $Bi(DPM)_3$, $BiMe_3$, $BiEt_3$ and Bi alcoholate, the organometallic complex of Sr is at least one selected from the group consisting of $Sr(DPM)_2$ and $Sr(PPM)_2$, the organometallic complex of Ca is at least one selected from the group consisting of $Ca(DPM)_2$ and $Ca(PPM)_2$, the organometallic complex of Cu is at least one selected from the group consisting of $Cu(DPM)_2$, $Cu(PPM)_2$ and $Cu(acac)_2$.

7. A method according to claim 1, wherein said carrier gas is at least one selected from the group consisting of Ar, He, Ne and $N_2$.

8. A method according to claim 1, wherein said oxidizing gas is at least one selected from the group consisting of $O_2$, $O_3$, air, $N_2O$ and $NO_2$.

9. A method according to claim 1, wherein the substrate temperature is 780° to 750° C. and the film formation speed is 1.0 to 2.0 nm/min.

10. A method according to claim 1, wherein the thickness of said Bi-Sr-Ca-Cu-O-type superconductive film is 100 to 1000 nm.

* * * * *